United States Patent
Duncan

(10) Patent No.: US 7,072,923 B2
(45) Date of Patent: Jul. 4, 2006

(54) METHOD AND APPARATUS FOR GENERATING DETERMINISTIC, NON-REPEATING, PSEUDO-RANDOM ADDRESSES

(75) Inventor: Kevin Duncan, Roseville, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/057,596

(22) Filed: Feb. 15, 2005

(65) Prior Publication Data

US 2005/0149591 A1 Jul. 7, 2005

Related U.S. Application Data

(63) Continuation of application No. 10/183,370, filed on Jun. 28, 2002, now Pat. No. 6,865,660.

(51) Int. Cl.
*G06F 12/00* (2006.01)

(52) U.S. Cl. ............... 708/250; 365/201; 365/230.09; 711/217; 714/728; 714/739

(58) Field of Classification Search ............ None
See application file for complete search history.

(56) References Cited

U.S. PATENT DOCUMENTS

| | | |
|---|---|---|
| 4,782,487 A | 11/1988 | Smelser |
| 5,187,676 A | 2/1993 | DeVane |
| 5,258,986 A | 11/1993 | Zerbe |
| 5,357,278 A | 10/1994 | Herz et al. |
| 5,719,913 A | 2/1998 | Maeno |
| 5,974,579 A | 10/1999 | Lepejian et al. |
| 6,011,748 A | 1/2000 | Lepejian et al. |
| 6,141,668 A | 10/2000 | Shimada |
| 6,691,142 B1 | 2/2004 | Howlett |

OTHER PUBLICATIONS

"Multiplicative Window Generators of Pseudo-random Test Vectors," Rajski et al., Proceedings of the 1996 European Design and Test Conference, 1996, pp. 42-48.

*Primary Examiner*—Christian P. Chace
(74) *Attorney, Agent, or Firm*—Dickstein Shapiro Morin & Oshinsky LLP

(57) ABSTRACT

A system and method for rapidly generating a series of non-repeating, deterministic, pseudo-random addresses is disclosed. A deterministic, pseudo-random number generator is implemented in hardware. Once a number in a pseudo-random sequence is generated, a pattern eliminator alters the number to remove any pattern existing in the low order bits. The number may then be combined with an offset and a base to form a memory address for testing a memory device. The generated memory address is output directly to the memory device being tested.

12 Claims, 3 Drawing Sheets

METHOD AND APPARATUS FOR GENERATING DETERMINISTIC, NON-REPEATING, PSEUDO-RANDOM ADDRESSES

This application is a continuation of application Ser. No. 10/183,370, filed Jun. 28, 2002 now U.S. Pat. No. 6,865,660, the entire disclosure of which is incorporated herein.

FIELD OF THE INVENTION

The present invention relates generally to pseudo-random number generators, and, more particularly to a deterministic, non-repeating, pseudo-random address generator.

BACKGROUND OF THE INVENTION

In semiconductor memory testing environments, it is often useful to generate random patterns of numbers in order to facilitate the simulation of real-world situations. However, the generation of genuinely random numbers is exceedingly complex and, in most instances, genuinely random numbers are not necessary. For most applications, a pseudo-random sequence of numbers will suffice. Pseudo-random sequences are finite sequences generated by a deterministic process but statistically indistinguishable from a random sequence. Pseudo-random numbers are used in many applications, not only because genuinely random numbers are very difficult to generate, but also because the lack of reproducibility in genuinely random numbers makes the validation of programs or applications that use random numbers extremely difficult.

Methods for generating a sequence of pseudo-random numbers are known in the art. A function called a generator is defined such that, when applied to a number, it yields the next number in the pseudo-random sequence. While any type of pseudo-random number generator can be used, for simplicity, and because it is the most commonly used generator, a linear congruential generator (LCG) is discussed below.

An LCG generates a deterministic, non-repeating, pseudo-random sequence. A subsequent number in the sequence ($X_n$) is generated from the current number ($X_{n-1}$) through the following equation:

$$X_n = (aX_{n-1} + c) \bmod (m) \quad (1)$$

where $X_{n-1}$ is the $(n-1)^{th}$ number of the sequence; a is a multiplier; c is an additive constant; m is the modulus. An initial value $X_0$ also makes up the LCG. $X_0$ is an initial value of $X_{n-1}$ to start the sequence and is usually any positive odd integer. When iterated, each resultant value of $X_n$ is then a member of the psuedo-random sequence. Because of the reduction mod (m) operation, $X_n$ will always fall in the range (0 through m−1) and, as a result, will eventually repeat itself. The length of the unrepeated sequence is called the period of the generator. A good generator is one with a long period and no discernible correlation between elements of the sequence.

The "seed" values are the values chosen for $X_0$, a, c, and m. The seed values are chosen to make the sequence look as random as possible. An exemplary set of seed values is:
$X_0$=any positive odd integer
a=16807
m=$2^{31}$−1 (or some other large prime number)
c=0

The generator described in Equation 1 with the above seed values has a period of m−1, that is, $2^{31}$−2 for m=$2^{31}$−1.

When using a binary system, such as a processor-based system, the seed values are often simplified even further in order to make the computation of the pseudo-random sequence faster. The following seed values provide a simplification of Equation 1 that sacrifices the period of the generator in favor of faster computation:
$X_0$=any positive odd integer
a=8z+5 (z is any positive integer)
m=$2^e$ (e is any positive integer)
c=0;

so that equation 1 then becomes $$X_n = (aX_{n-1}) \bmod (m) \quad (2)$$

By using the above-identified exemplary seed values, the addition of c is eliminated, and the modulus of the product $aX_{n-1}$ can be more quickly determined. That is, when using a binary system, since m is a power of 2, regardless of what integer value is chosen for e, the result of the modulus of m will be the e least significant bits of the product of the multiplier, a, and the $(n-1)^{th}$ number of the sequence, $X_{n-1}$. For example, if e=4, then $aX_{n-1}$ mod (m) is simply the 4 least significant bits of $aX_{n-1}$. Thus, using a binary system eliminates the necessity of actually performing a lengthy reduction mod m calculation. By using fewer operations, the processing time necessary to determine $X_n$ in a binary system can be reduced.

Although simpler, the binary system approach described above is not ideal because the value for m, by definition, is not prime. Since the value of m is not prime, the period of the generator is reduced from a maximum of m−1 down to $2^{e-2}$ or m/4. In addition, since m is a power of 2, the low order bits of each of the generated numbers are not random. Specifically, depending on the seed values, bits 0 and 1 are fixed for all numbers generated and bits 2 and 3 occur in a cyclical pattern.

For example, if the above formula is used with seed values of $X_0$=1; a=5; m=16 (e=4); and c=0; the following sequence would be generated: 1, 5, 9, 13, 1, 5, 9, 13, 1 . . . . This sequence in binary form appears as follows:

TABLE 1

| N | Xn Integer | Xn Binary |
|---|---|---|
| 0 | 1 | 0001 |
| 1 | 5 | 0101 |
| 2 | 9 | 1001 |
| 3 | 13 | 1101 |

As can be seen from Table 1, the two least significant bits for each value $x_n$ (i.e., for each number generated in the sequence of pseudo-random numbers) are fixed at "01" and the two most significant bits cycle through the binary values 00, 01, 10, 11, 00, 01, 10, 11 . . . (i.e., decimal values 0, 1, 2, 3, 0, 1, 2, . . . ). Thus, the random nature of the sequence generated by the LCG is compromised through implementing simpler seed values with a binary system. While this is a simplified example, a similar pattern for bits 0–3 would occur when using the simplified seed values associated with a binary system, as described above for Equation 2.

After the above-described deterministic, non-repeating, pseudo-random numbers are generated in software using an LCG, they must be transmitted to another location in a memory circuit where memory locations are being tested.

This generation in software and then transportation via hardware to a memory location is a relatively slow process.

For example, when a memory device is being tested in a computer, the speed with which the software can get the processor to generate the pseudo-random addresses and move them to a location to be used for testing are the limiting factors for implementing the LCG in software. Thus, it is desirable to develop a system for speedily generating a sequence of deterministic, non-repeating, pseudo-random numbers, to assemble memory addresses from the sequence of pseudo-random numbers and to use the assembled addresses in a memory testing environment.

BRIEF SUMMARY OF THE INVENTION

The present invention provides a unique method and apparatus for rapidly generating a series of non-repeating, deterministic, pseudo-random addresses. In accordance with an exemplary embodiment of the present invention, a deterministic, pseudo-random number generator is implemented in hardware. Once a number in a pseudo-random sequence is generated, a pattern eliminator alters the number to remove any pattern existing in the low order bits. The number may then be combined with an offset and a base to form a memory address for testing a memory device. The generated memory address is output directly to the memory device being tested.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
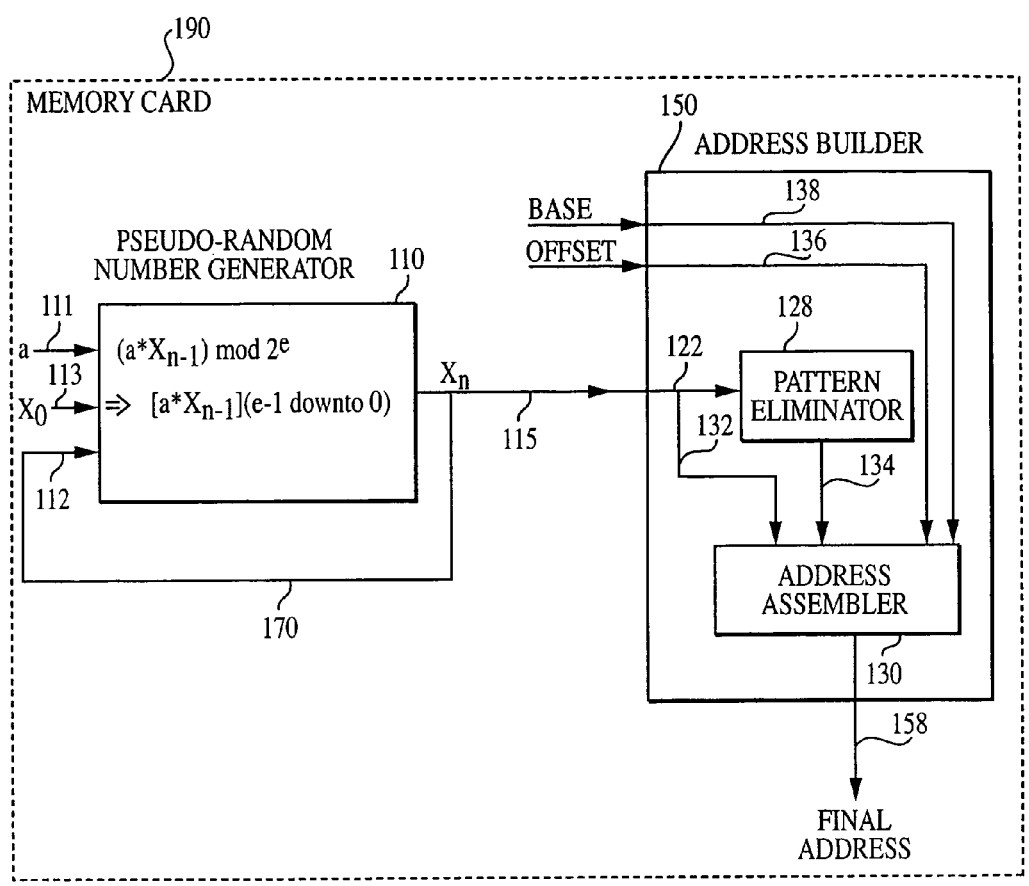
FIG. 1 is a block diagram of a pseudo-random address generator system, in accordance with an exemplary embodiment of the invention.

FIG. 1 depicts a block diagram of an exemplary embodiment of the present invention. The components illustrated in FIG. 1 may, for example, be assembled on a computer memory card 190 (e.g., a PC card, a Personal Computer Interface (PCI) card, a Personal Computer Memory Card International Association (PCMCIA) card, etc.).

In a preferred embodiment of the present invention, the components of FIG. 1 are provided on a PCI card 190. The PCI card 190 contains the components that generate a pseudo-random number and create a final memory address for testing. The PCI card 190 then transmits the memory address to the memory device being tested.

As depicted in FIG. 1, the memory card 190 contains a pseudo-random number generator 110, and an address builder 150. Pseudo-random number generator 110 contains three input lines 111, 112, 113 and one output line 115. Input line 111 receives a binary representation of a value for the multiplier, a. Input line 113 receives a binary representation of an initial number, $X_0$, in a sequence of pseudo-random numbers. Input line 112 receives the e−1 down to 0 bits of the number generated by the generator 110 via a feedback loop 170. The e−1 down to 0 bits of $X_n$ are generated by the generator 110 as $a*X_0 \mod (2^e)$. The e−1 down to 0 bits are the lower one-half of the bits representing the product of $a*X_0$. As described above, using a binary system simplifies the calculation of $a*X_0 \mod (2^e)$ to merely retaining the lower one-half of bits (e−1 down to 0 bits) of the product and discarding the upper one-half of the bits of that product. The lower one-half bits of the product are the binary representation of the next number, $X_n$, in the sequence of pseudo-random numbers generated by the generator 110.

The specific hardware-based multiplier employed in the generator 110 is not critical; however, positive results have been realized with XILINX® programmable logic products. The output line 115 of the pseudo-random number generator 110 is coupled to an input of the address builder 150 which in turn is coupled to an input 122 of pattern eliminator 128 and an input 132 of address assembler 130.

Pattern eliminator 120 also contains one output line 134 coupled to address assembler 130. The output line sends a modified $X_n$ (if necessary, as will be described below) to address assembler 130.

Still referring to FIG. 1, address assembler 130 has four input lines 132, 134, 136, 138 and one output line 158. The first and second input lines 132, 134 are described above. The third input line 136 receives an offset value as an input. The offset, as will be described more fully below, is a constant, that may be specified by the user. The offset value is used to specify the location of the generated pseudo-random number within the final generated memory address. For example, if the final memory address is 36 bits long and the pseudo-random number generated is 18 bits long, then the offset can be used to specify which bit locations in the 36-bit address contain the 18-bit pseudo-random number.

The fourth input line 138 to address assembler 130 receives a base as an input. The base, as will be described below, is a predetermined number of bits used to fill in those bits of the memory address not being used by the pseudo-random number. In the example given above, the base would occupy, e.g., the remaining 18 bits of the 36-bit memory address. Once address assembler 130 receives the four input values, it assembles the final memory address to be transmitted to the memory location being tested.

As mentioned above in connection with Table 1, when simplified seed values associated with a binary system are implemented, a pattern can develop in the lower order bits of the generated pseudo-random number. There are two possible patterns in the lower bits depending upon whether or not bit 1 of the initial value $X_0$ is an "0" or a "1". For example, bits 0 and 1 may respectively be a fixed "1" and "0". Bits 2 and 3 may run a cycle from binary 00 through binary 11.

One simple method to counteract these patterns, and as may be employed by the pattern eliminator, is to remove the lower two bits (i.e., bits 0 and 1) of the pseudo-random number, thus, removing the bits respectively fixed at, e.g., "1" and "0". Another option is to choose two higher order bits from the pseudo-random number and hardwire them into bits 0 and 1. Since the higher order bits would be random, the fixed nature of bits 0 and 1 would be eliminated.

In another exemplary embodiment of the invention, in order to eliminate the patterns that may develop in the lower order bits, bits 4 through 7 of the generated pseudo-random number ($X_n$) are exclusive OR'ed (XOR). If bit 1 of the initial value $X_0$ was "0" and the result of the XOR operation is "0", then bit 1 of the generated number is inverted. If the result of the XOR operation is "1", then bit 0 is inverted. Alternatively, if bit 1 of the initial value $X_0$ was a "1", then the opposite occurs. The above-described changes to the lower bits are carried out by the pattern eliminator 124 and the now-modified generated number, $X_n$, is forwarded to the address assembler 130.

Ideally, the choice for m (i.e., $2^e$) is the word size of the memory device being tested, thereby ensuring that the entire address is a generated pseudo-random number; however, certain limitations, including hardware, may not make this practical. In those cases, as briefly described above, the user can supply a base value and an offset value.

For example, assume the memory system being tested uses a 36-bit address, and that an 18-bit pseudo-random number, $X_n$, is generated in accordance with an exemplary embodiment of the invention. Further, assume the addresses are aligned on 64-byte boundaries. Table 2 depicts an example of the relative locations, within the 36-bits of the address, of the base (represented by "B") and the pseudo-random number, $X_n$ (represented by "R").

TABLE 2

| 35 32 | 31       24 | 23       16 | 15        8 | 7        0 |
|-------|-------------|-------------|-------------|------------|
| BBBB  | BBBBBBBB    | RRRRRRRR    | RRRRRRRR    | RR000000   |

In this example, the lower 6 bits are "0" in order to have the address line up on the 64-byte boundaries. The 18-bits represented by "R" indicate the pseudo-random number at an offset of 0. It should be noted that, under this example, the 18-bit pseudo-random number will produce a 64K string of non-repeating numbers that can be reproduced by using the same initial user-supplied seed values.

It is possible, by using the offset field, to specify where the 18-bit pseudo-random number will be located within the upper 30-bits of the address. The offset, in this implementation, is a number between 0 and 12, where 0 is the default location shown above and 1–12 are the number of places the field is to be shifted to the left.

EXAMPLE 1

Offset=1

TABLE 3

| 35 32 | 31       24 | 23       16 | 15        8 | 7        0 |
|-------|-------------|-------------|-------------|------------|
| BBBB  | BBBBBBBR    | RRRRRRRR    | RRRRRRRR    | RB000000   |

In the example depicted in Table 3, the pseudo-random number is shifted one place to the left and the user would be responsible for specifying the upper 11 bits as well as bit 6 in order to complete the memory address. The hardware places the upper 11 bits of the user-filled 12-bit base field into the upper 11 bits of the memory address and places the lower bit of the base field into bit 6 of the memory address.

EXAMPLE 2

Offset=5

TABLE 4

| 35 32 | 31       24 | 23       16 | 15        8 | 7        0 |
|-------|-------------|-------------|-------------|------------|
| BBBB  | BBBRRRRR    | RRRRRRRR    | RRRRRBBB    | BB000000   |

In the example depicted in Table 4, the pseudo-random number is shifted five places to the left and the user would be responsible for specifying the upper 7 bits as well as bits 10 down to 6 in order to complete the address. The hardware places the upper 7 bits of the user-filled 12-bit base field into the upper 7 bits of the memory address and places the lower 5 bits of the base field into bits 10 down to 6 of the memory address.

The purpose of using this offset method is to allow the user to specify different ranges within the memory address space to utilize the pseudo-random number, thereby resulting in many different variations in the memory addresses generated.

Figure 2:
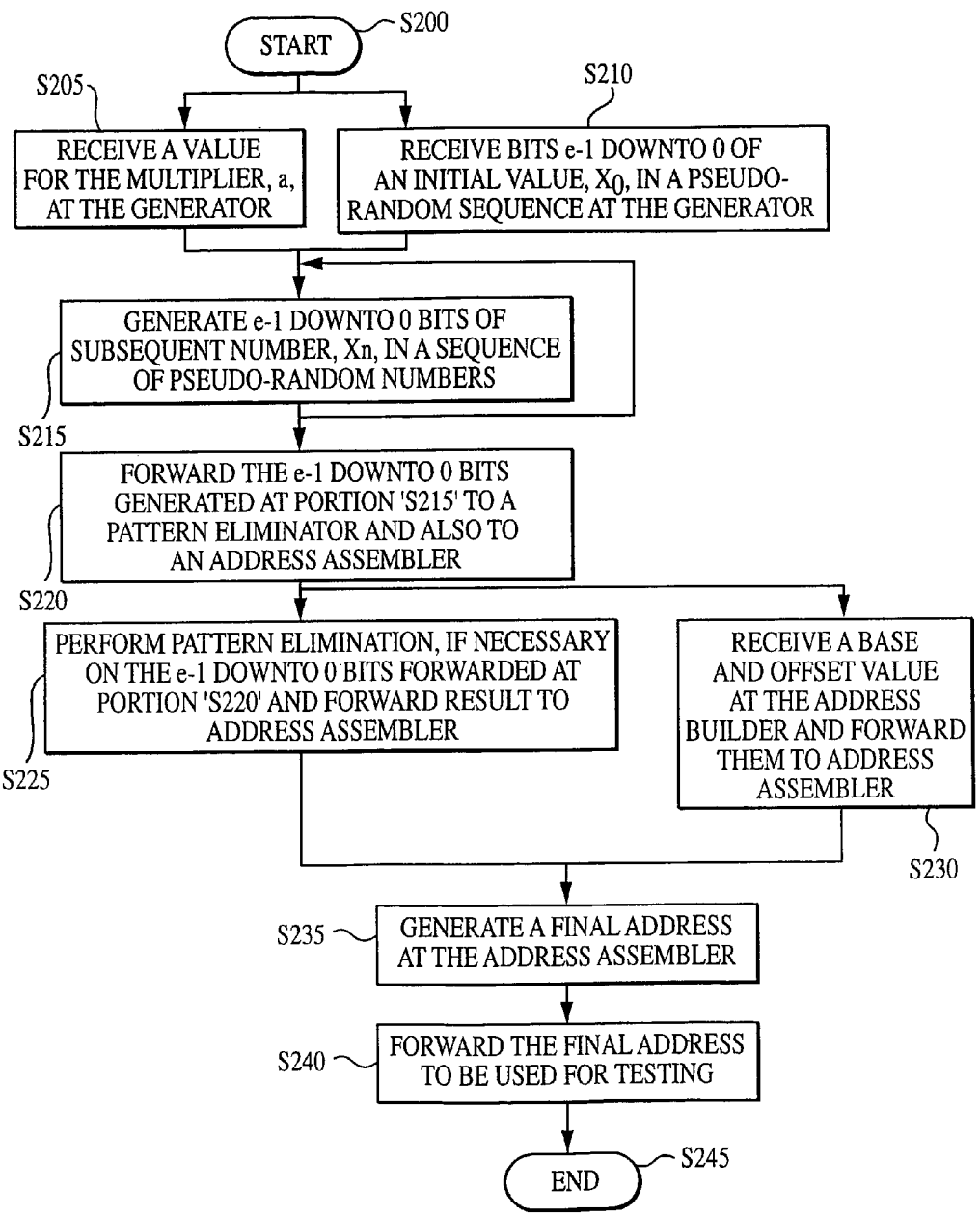
FIG. 2 is a flowchart depicting an operation flow of a method for generating a series of non-repeating, deterministic, pseudo-random addresses, in accordance with the FIG. 1 exemplary embodiment of the invention.

Turning to FIG. 2, a flowchart illustrating an operational flow of the FIG. 1 system is depicted, in accordance with an exemplary embodiment of the invention. The process begins at segment S200. At segment S205, the pseudo-random number generator 110 receives a value for a multiplier, a. At segment S210, the generator 110 receives an initial value $X_0$ in the pseudo-random sequence.

At segment S215, the generator generates $X_n$, in the pseudo-random sequence. As described above in connection with FIG. 1, the upper one-half of bits representing the product of a and $X_{n-1}$ are discarded and the lower one-half of bits (i.e., the e−1 down to 0 bits) of the product are retained as $X_n$. At segment S220, the value of $X_n$ generated at portion S215 is forwarded to the pattern eliminator 128 and also to the address assembler 130.

At segment S225, pattern elimination, if necessary, is performed on $X_n$, as received at the pattern eliminator 128 and then the modified number $X_n$ is forwarded to the address assembler 130.

At segment S230, a base and an offset are received at the address builder 150 and forwarded to the address assembler 130. The address assembler 130 then assembles and generates the final address, in the manner described above, at segment S235. At segment S240, the final address is forwarded to the memory location being tested.

Figure 3:
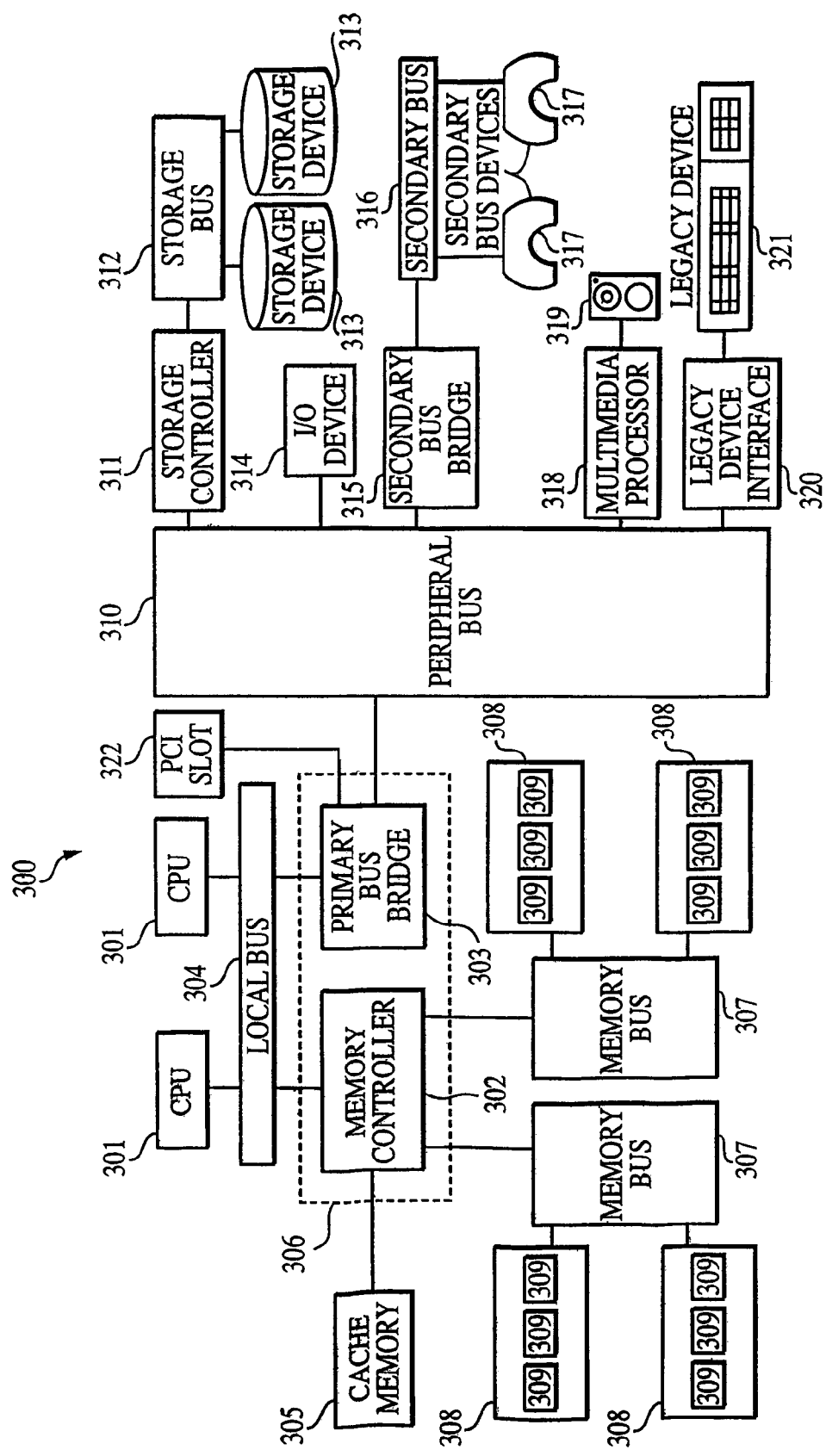
FIG. 3 is a block diagram of a processor system implementing the pseudo-random address generator system of FIG. 1, in accordance with an exemplary embodiment of the invention.

A memory card (e.g., a PC card, a PCI card, a PCMCIA card, etc.) incorporating the present invention, while connected to a processing system, such as the one illustrated in FIG. 3, is capable of quickly generating a sequence of deterministic, pseudo-random numbers that can be used to test specific memory locations either within or without the processing system.

FIG. 3 illustrates an exemplary processing system 300 employing the pseudo-random address generator of FIG. 1. The processing system 300 includes one or more processors 301 coupled to a local bus 304. A memory controller 302 and a primary bus bridge 303 are also coupled the local bus 304. The processing system 300 may include multiple memory controllers 302 and/or multiple primary bus bridges 303.

The memory controller 302 and the primary bus bridge 303 may be integrated as a single device 306.

The memory controller 302 is also coupled to one or more memory buses 307. Each memory bus accepts memory components 308. Memory devices, which are being tested, can be added and removed from processor system 300 without affecting the overall functioning of processor system 300. Any memory device which is being tested can be connected to memory bus 307. In a preferred embodiment of the present invention, a PCI card embodying the present invention is connected to a PCI slot 322.

The memory components 308, including memory components being tested in accordance with the present invention, may be a memory card or a memory module. Examples of memory modules include single inline memory modules (SIMMs) and dual inline memory modules (DIMMs). The memory components 308 may include one or more additional devices 309. For example, in a SIMM or DIMM, the additional device 309 might be a configuration memory, such as a serial presence detect (SPD) memory. The memory controller 302 may also be coupled to a cache memory 305. The cache memory 305 may be the only cache memory in the processing system. Alternatively, other devices, for example, processors 301 may also include cache memories, which may form a cache hierarchy with cache memory 305. If the processing system 300 include peripherals or controllers which are bus masters or which support direct memory access (DMA), the memory controller 302 may implement a cache coherency protocol. If the memory controller 302 is coupled to a plurality of memory buses 307, each memory bus 307 may be operated in parallel, or different address ranges may be mapped to different memory buses 307.

The primary bus bridge 303 is coupled to at least one peripheral bus 310. Various devices, such as peripherals or additional bus bridges may be coupled to the peripheral bus 310. These devices may include a storage controller 311, an miscellaneous I/O device 314, a secondary bus bridge 315, a multimedia processor 318, and an legacy device interface 320. In a personal computer, for example, the special purpose port might be the Accelerated Graphics Port (AGP), used to couple a high performance video card to the processing system 300.

The storage controller 311 couples one or more storage devices 313, via a storage bus 312, to the peripheral bus 310. For example, the storage controller 311 may be a SCSI controller and storage devices 313 may be SCSI discs. The I/O device 314 may be any sort of peripheral. For example, the I/O device 314 may be an local area network interface, such as an Ethernet card. The secondary bus bridge may be used to interface additional devices via another bus to the processing system. For example, the secondary bus bridge may be an universal serial port (USB) controller used to couple USB devices 317 via to the processing system 300. The multimedia processor 318 may be a sound card, a video capture card, or any other type of media interface, which may also be coupled to one additional devices such as speakers 319. The legacy device interface 320 is used to couple legacy devices, for example, older styled keyboards and mice, to the processing system 300.

The processing system 300 illustrated in FIG. 3 is only an exemplary processing system with which the invention may be used. While FIG. 3 illustrates a processing architecture especially suitable for a general purpose computer, such as a personal computer or a workstation, it should be recognized that well known modifications can be made to configure the processing system 300 to become more suitable for use in a variety of applications. For example, many electronic devices which require processing may be implemented using a simpler architecture which relies on a CPU 301 coupled to memory components 308 and/or memory devices 309. The modifications may include, for example, elimination of unnecessary components, addition of specialized devices or circuits, and/or integration of a plurality of devices.

It is desirable to have a fast and easy way to generate a sequence of deterministic, non-repeating, pseudo-random numbers in a test environment. By using the described system and method, a simple hardware implementation of this is possible. As described, exemplary embodiments of the present invention can be used to generate a stream of deterministic, non-repeating, pseudo-random addresses for a memory circuit (e.g., DRAM, SRAM, PCRAM, MRAM, etc.). Other applications could include performance-monitoring algorithms requiring deterministic results, the testing of data mining subsystems (systems that have random memory and disk access in their nature) with reproducible results, testing fie access patterns (e.g., why one file access takes a standard deviation longer than the average access, or anything else requiring a deterministic, statistically random pattern).

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with a specific number of bits (e.g., 36), it should be readily apparent that any other number of bits may be used to implement the invention and achieve the same results.

In addition, although the invention has been described in connection with a specific type of deterministic pseudo-random number generator (LCG), it should be readily apparent that any other type of pseudo-random number generator may be used instead. Furthermore, although an exemplary embodiment of the invention, as depicted in FIG. 1, is described in connection with specific circuit portions with specific interconnections between and amongst those circuit portions, it should be readily apparent that any other circuit portions, or combinations of circuit portions or interconnections can be substituted for the specific implementation described in FIG. 1 while still being within the spirit and scope of the invention. Accordingly, the invention is not limited by the foregoing description or drawings, but is only limited by the scope of the appended claims.

What is claimed as new and desired to be protected by Letters Patent of the United Stated is:

1. A method for generating a sequence of deterministic, pseudo-random numbers, the method comprising:
    multiplying a first number in said sequence of deterministic, pseudo-random numbers by a multiplier; and
    discarding all of the product of said act of multiplying except for a first plurality of low order bits representing a portion of said product, said first plurality of low order bits also representing a next number in said sequence of deterministic, pseudo-random numbers.

2. The method of claim 1 further comprising:
    multiplying said first plurality of low order bits by said multiplier; and
    discarding all of the product of said first plurality of low order bits and said multiplier except for a second plurality of low order bits, said second plurality of low order bits representing a second next number in said sequence of deterministic, pseudo-random numbers.

3. The method of claim 1 further comprising eliminating a pattern existing in said first plurality of low order bits.

4. The method of claim 1, wherein said act of discarding comprises discarding one-half of the bits representing said product.

5. The method of claim 4, wherein said act of discarding comprises discarding the upper 18 bits of said product and retaining the lower 18 bits of said product.

6. The method of claim 1 further comprising:
using said sequence of deterministic, pseudo-random numbers to represent memory addresses of a memory circuit.

7. The method of claim 6 further comprising:
testing a portion of said memory circuit represented by said next number in said sequence of deterministic, pseudo-random numbers.

8. The method of claim 1, wherein said memory circuit is one of a DRAM, SRAM, PCRAM and MRAM.

9. The method of claim 1 further comprising:
communicating said sequence of deterministic, pseudo-random numbers to test a data mining subsystem.

10. The method of claim 1 further comprising:
communicating said sequence of deterministic, pseudo-random numbers to test file access patterns.

11. The method of claim 1 further comprising:
communicating said sequence of deterministic, pseudo-random numbers to a memory circuit.

12. The method of claim 11 further comprising:
testing said memory circuit with said sequence of deterministic, pseudo-random numbers representing a sequence of memory addresses of said memory circuit.

* * * * *

UNITED STATES PATENT AND TRADEMARK OFFICE
CERTIFICATE OF CORRECTION

PATENT NO. : 7,072,923 B2 Page 1 of 1
APPLICATION NO. : 11/057596
DATED : July 4, 2006
INVENTOR(S) : Kevin Duncan It is certified that error appears in the above-identified patent and that said Letters Patent is hereby corrected as shown below:

In the Specification, the PTO made the following error to be corrected:

Column 1, line 45, "$_n=(aX_{n-1}+c) \mod (m)$" should read --$X_n=(aX_{n-1}+c) \mod (m)$--;

Column 7:

Line 26, "include" should read --includes--;

Lines 36-37, "an miscellaneous" should read --a miscellaneous--;

Line 38, "an legacy" should read --a legacy--;

Line 48, "an local" should read --a local--;

Line 52, "an universal" should read --a universal--;

Line 53, "317 via to the" should read --317 to the--; and

Line 56, "to one additional" should read --to additional--.

Signed and Sealed this

Fourth Day of March, 2008

JON W. DUDAS
*Director of the United States Patent and Trademark Office*